(12) United States Patent
Jung et al.

(10) Patent No.: US 9,711,627 B2
(45) Date of Patent: Jul. 18, 2017

(54) POWER SEMICONDUCTOR DEVICE AND FABRICATION METHOD THEREOF

(71) Applicant: Semiconductor Manufacturing International (Shanghai) Corporation, Shanghai (CN)

(72) Inventors: Dae Sub Jung, Shanghai (CN); Bo Liu, Shanghai (CN)

(73) Assignee: SEMICONDUCTOR MANUFACTURING INTERNATIONAL (SHANGHAI) CORPORATION, Shanghai (CN)

( * ) Notice: Subject to any disclaimer, the term of this patent is extended or adjusted under 35 U.S.C. 154(b) by 0 days.

(21) Appl. No.: 15/016,655

(22) Filed: Feb. 5, 2016

(65) Prior Publication Data
US 2016/0293745 A1 Oct. 6, 2016

(30) Foreign Application Priority Data
Mar. 30, 2015 (CN) .......................... 2015 1 0144324

(51) Int. Cl.
*H01L 29/739* (2006.01)
*H01L 29/66* (2006.01)
*H01L 29/06* (2006.01)
*H01L 29/267* (2006.01)

(52) U.S. Cl.
CPC ........ *H01L 29/7395* (2013.01); *H01L 29/063* (2013.01); *H01L 29/0634* (2013.01); *H01L 29/267* (2013.01); *H01L 29/66333* (2013.01); *H01L 29/7396* (2013.01)

(58) Field of Classification Search
None
See application file for complete search history.

(56) References Cited

U.S. PATENT DOCUMENTS

| 2010/0123186 A1* | 5/2010 | Ohta ................... H01L 29/0634 257/329 |
| 2014/0138737 A1* | 5/2014 | Bobde .................. H01L 29/402 257/140 |
| 2014/0374819 A1* | 12/2014 | Niimura .............. H01L 29/7827 257/329 |

* cited by examiner

*Primary Examiner* — Minh-Loan Tran
(74) *Attorney, Agent, or Firm* — Anova Law Group, PLLC

(57) ABSTRACT

A method for forming a power semiconductor device is provided. The method includes providing a substrate having a first surface and a second surface; and forming a plurality of trenches in the second surface of the substrate. The method also includes forming a semiconductor pillar in each of the plurality of trenches, wherein the semiconductor pillars and the substrate form a plurality of super junctions of the power semiconductor device for increasing the breakdown voltage of the power semiconductor device and reducing the on-stage voltage of the power semiconductor device; and forming a gate structure on the first surface of the substrate. Further, the method includes forming a plurality of well regions in the first surface of the substrate around the gate structure; and forming a source region in each of the plurality of well regions around the gate structure.

15 Claims, 9 Drawing Sheets

POWER SEMICONDUCTOR DEVICE AND FABRICATION METHOD THEREOF

CROSS-REFERENCES TO RELATED APPLICATIONS

This application claims the priority of Chinese patent application No. 201510144324.7, filed on Mar. 30, 2015, the entirety of which is incorporated herein by reference.

FIELD OF THE INVENTION

The present invention generally relates to the field of semiconductor technology and, more particularly, relates to power semiconductor devices and fabrication processes thereof.

BACKGROUND

In the field of the semiconductor technology, Insulated-Gate Bipolar Transistor (IGBT) is one of the mainstream large current switch devices. The IGBT has the advantages including high breakdown voltage, and low on-state voltage, etc.

As shown in FIG. 1, the IGBT includes a substrate 1 doped with N-type ions; a gate 2 formed on the front surface S1 of the substrate 1; a P-type well region 3 formed in the substrate 1 and penetrating under the gate 2; and a source 4 doped with N-type ions formed in the P-type well region 3 at one side of the gate 2. The source 4 and the P-type well region 3 are electrically connected by the metal electrode 5; and the gate 2 and the metal electrode 5 are electrically insulated. Further, the IGBT also includes a buffer layer 6 doped with N-type ions formed on the back surface S2 of the substrate 1; and a collector layer 7 doped with P-type ions formed on the buffer layer 6. Along a direction perpendicular to the front surface S1, the P-type well region 3, the substrate 1, and the collector layer 7 form a PNP transistor. The substrate 1 is the wide base of the PNP transistor.

A positive voltage is always applied on the collector layer 7. To turn on the IGBT, a turn-on voltage is applied to the gate 2 to form a channel on the surface of the P well region 3 under the gate 2. Thus, a base current is provided to the base region of the PNP transistor and the transistor is turned on. As shown in FIG. 1, the arrows illustrate the current direction. The doping concentration of the buffer layer 6 is higher than the doping concentration of the substrate 1. Lager number of carriers flow into drift region 1 whose concentration is higher than the intrinsic concentration of the N minus drift region. Thus, the conductance of substrate 1 is greatly reduced, which is called conductance modulation effect; and the current is increased as well. Accordingly, the on-state voltage of the IGBT is reduced. To turn off the IGBT, a turn-off voltage is applied between the gate 2 and the metal electrode 5. The channel disappears, and the IGBT is turned off.

Because the positive voltage is always applied on the collector layer 7, after turning off the IGBT, the PN junction between the P well region 3 and the substrate 1 is reverse biased. When the voltage is higher than the breakdown voltage of the PN junction, the IGBT is damaged.

Reducing the doping concentration of the substrate 1 is able to increase the breakdown voltage (BVDss) of the power device. However, if the doping concentration of the substrate 1 is relatively small, the on-state resistance (Rdson) of the channel region in the substrate 1 is increased; and the on-state voltage of the IGBT is relatively high. Oppositely, increasing the doping concentration of the substrate 1 is able to lower the on-state voltage of the IGBT, but the breakdown voltage of the IGBT will be reduced. Therefore, the on-resistance (Rdson) and the breakdown voltage (BVDss) of the IGBT would have a restriction.

FIG. 2 illustrates an existing approach to break the restriction between the on-state resistance (Rdson) and the breakdown voltage (BVDss) of the IGBT. The approach is referred as super junction technique.

As shown in FIG. 2, a P-type region 8 is formed under the P-type well region 3. The P-type region 8 and the substrate 1 form a PN junction, i.e., super junction. During turning-off, a depletion region is formed by the PN junction between the substrate 1 and the P-type region 8, and fully depleted at last.

FIG. 3 illustrates the electric field distribution in the substrate 1 under the well region 3 of an existing IGBT at off-state without using supper-junction. Ec is the peak value of the electric field. The "y" axis refers to a direction from the first surface S1 to the second surface S2. As shown in FIG. 3, at the off-state of the IGBT, the electric field in the substrate 1 is distributed as a triangle, The peak value of the electric field (Ec) is at P-Well N Drift junction FIG. 4 illustrates the electric field distribution of an IGBT with a supper junction. The "y" axis refers to a direction from the first surface S1 point to the second surface S2. As shown in FIG. 4, the electric field in the substrate 1 is distributed as a rectangle, the peak value of the electric field (Ec) is away from the interface between the substrate 1 and the P-type well region 3. Comparing with the IGBT without a super junction, during the turning-off process, the depletion region between two adjacent P-type regions 8 is connected when the reverse bias is increased to a certain value. Thus, the electric field in the substrate 1 gradually become a rectangular distribution. Accordingly, the peak value of the electric field is reduced when applying the same collector voltage; and the breakdown voltage of the IGBT with the super junction is increased. At the same time, the on-state voltage of the IGBT with the super junction is not affected. Further, during the turning-off process, the P-type doping regions 8 provide a releasing channel for the carriers near to the channel region of the IGBT. Thus, the switch speed of the IGBT with the super junction is increased.

Because electric field of the IGBT would move to the deeper region of the substrate 1 (toward to the back surface S2), the deeper the super junction is, the higher the breakdown voltage of the IGBT is. However, the conventional ion implantation process is unable to obtain a relative deep P-type doping regions 8 by a single step.

As shown in FIG. 2, an existing method for forming the P-type doping regions 8 includes forming a plurality of stacked epitaxial layers 9. The plurality of the stacked epitaxial layers 9 form the substrate 1. After forming each of the epitaxial layers 9 by a selective epitaxial growth process, a P-type ion implantation is performed on the epitaxial layer 9. After a plurality of selective epitaxial growth processes, the P-type doping regions in the plurality of epitaxial layers 9 stack together; and the P-type doping regions 8 are formed. Thus, the processes for forming the P-type doping regions 8 is relatively complex, and the fabrication time of the P-type doping regions 8 is relatively long. Thus, the production cost of the IGBT is relatively high.

The disclosed device structures and methods are directed to solve one or more problems set forth above and other problems.

BRIEF SUMMARY OF THE DISCLOSURE

One aspect of the present disclosure includes providing a method for fabricating a power semiconductor device. The method includes providing a substrate having a first surface and a second surface; and forming a plurality of trenches in the second surface of the substrate. The method also includes forming a semiconductor pillar in each of the plurality of trenches, wherein the semiconductor pillars and the substrate form a plurality of super junctions of the power semiconductor device for increasing the breakdown voltage of the power semiconductor device and reducing the on-stage voltage of the power semiconductor device; and forming a gate structure on the first surface of the substrate. Further, the method includes forming a plurality of well regions in the first surface of the substrate around the gate structure; and forming a source region in each of the plurality of well regions at around of the gate structure.

Another aspect of the present disclosure includes providing a method for fabricating a power semiconductor device. The method includes providing a substrate having a first surface and a second surface; and forming a plurality of trenches in the first surface of the substrate. The method also includes forming a semiconductor pillar in each of the plurality of trenches, wherein the semiconductor pillars and the substrate form a plurality of super junctions of the power device for increasing the breakdown voltage of the power semiconductor device and reducing the on-stage voltage of the power semiconductor device; and forming a second substrate on the first surface of the substrate and surfaces of the plurality of the semiconductor pillars. Further, the method includes forming a gate structure on a top surface of the second substrate; forming a plurality of well regions in the top surface of the second substrate at both sides of the gate structure; and forming a source region in each of the plurality of well regions at both sides of the gate structure.

Another aspect of the present disclosure includes providing a power semiconductor device. The power semiconductor device includes a substrate having a first surface and a second surface; at least one gate structure formed on the first surface of the substrate. Further, the power semiconductor device also includes a plurality of well regions formed in the first surface of the substrate around the gate structure; and a source region formed in each of the plurality of well regions around the gate structure. Further, the power semiconductor device includes a plurality of semiconductor pillars formed in the substrate, wherein the plurality of the semiconductor pillars and the substrate form a plurality of super junctions of the power semiconductor device for increasing the breakdown voltage of the power semiconductor device and reducing the on-stage voltage of the power semiconductor device.

Other aspects of the present disclosure can be understood by those skilled in the art in light of the description, the claims, and the drawings of the present disclosure.

DETAILED DESCRIPTION

Reference will now be made in detail to exemplary embodiments of the invention, which are illustrated in the accompanying drawings. Wherever possible, the same reference numbers will be used throughout the drawings to refer to the same or like parts.

Figure 17:
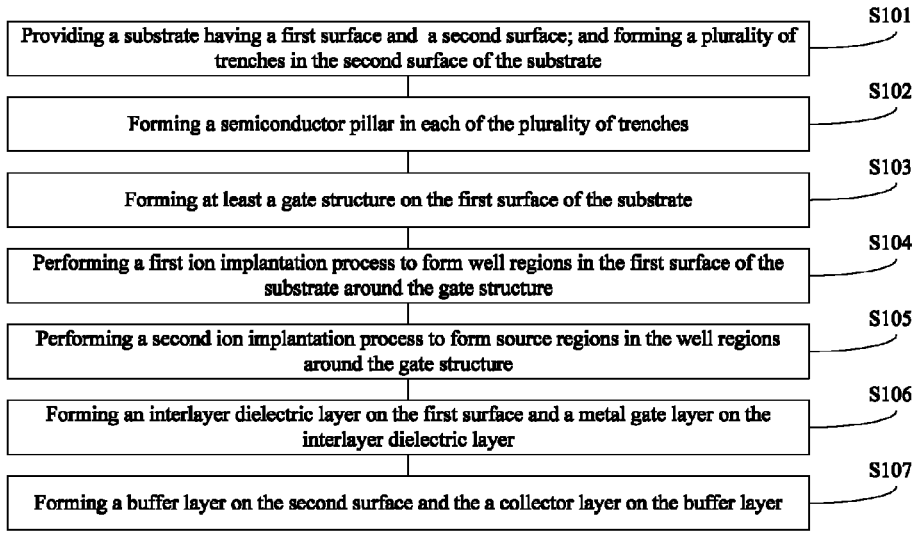
FIG. 17 illustrates an exemplary fabrication process of a power device consistent with the disclosed embodiments.

FIG. 17 illustrates an exemplary fabrication process of a power semiconductor device consistent with the disclosed embodiments; and FIGS. 5~12 illustrate semiconductor structures corresponding to certain stages of the exemplary fabrication process.

Figure 1:
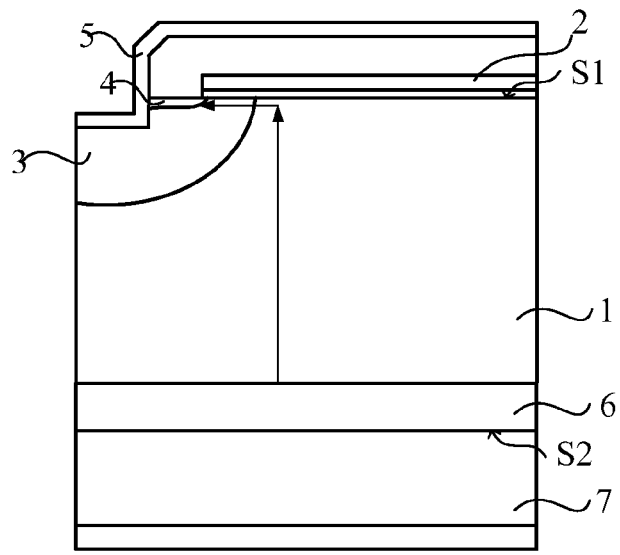
FIG. 1 illustrates an existing IGBT structure.
Figure 2:
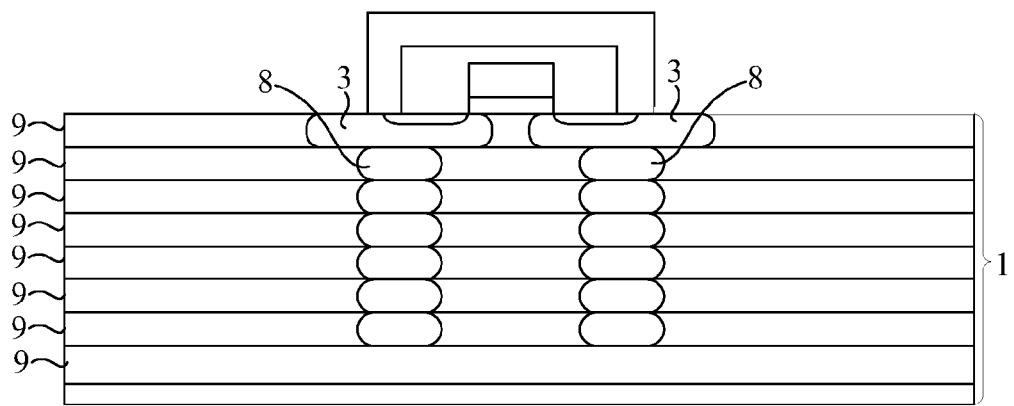
FIG. 2 illustrates an existing IGBT structure with a super junction.
Figure 3:
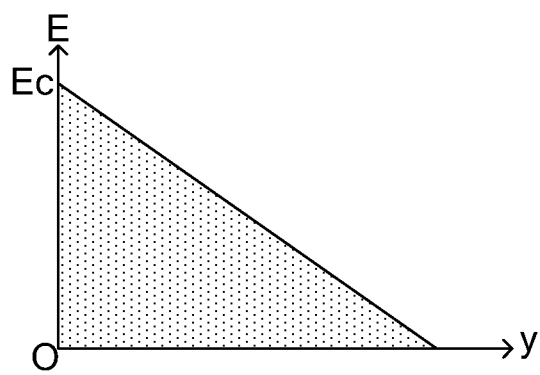
FIG. 3 illustrates an electric field distribution of the high-voltage electric field in the substrate under the well region along the "y" direction during a process for turning off the existing PNP type IGBT structure without a supper-junction.
Figure 4:
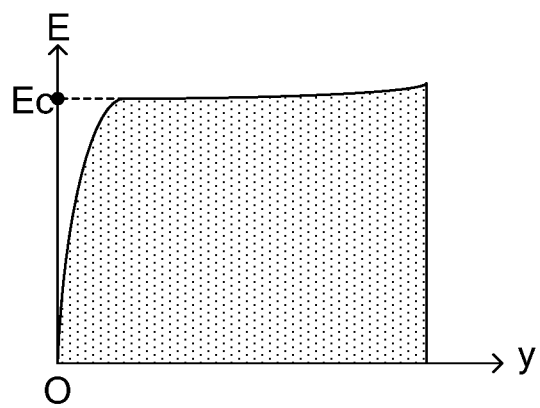
FIG. 4 illustrates an electric field distribution of the high-voltage electric field in the substrate under the well region along the "y" direction during a process for turning off the existing IGBT structure with a supper-junction.
Figure 5:
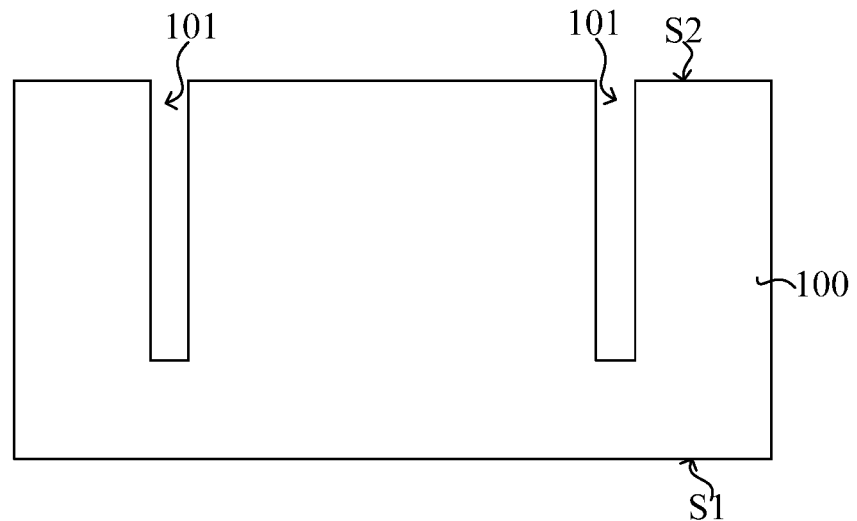
FIGS. 5~12 illustrate semiconductor structures corresponding to certain stages of an exemplary fabrication process of a power semiconductor device consistent with the disclosed embodiments.

As shown in FIG. 17, at the beginning of fabrication process, a substrate with certain structures is provided (S101). FIG. 5 illustrates a corresponding semiconductor structure.

As shown in FIG. 5, a substrate 100 is provided. The substrate 100 may have a first surface S1 and an opposite facing second surface S2. In certain other embodiments, the first surface S1 may be referred as a front surface; and the second surface S2 may be referred as a back surface.

The substrate 100 may be doped with first type doping ions. In one embodiment, the first type doping ions are N-type doping ions.

The substrate 100 may be made of any appropriate semiconductor materials, such as single crystal silicon, polysilicon, silicon on insulator (SOI), silicon germanium, carborundum, indium antimonite, lead telluride, indium arsenide, indium phosphide, gallium arsenide, gallium antimonite, alloy semiconductor or a combination thereof. In one embodiment, the substrate 100 is made of silicon. Thus, the production cost of the power device may be reduced. The substrate 100 provides a base for subsequent devices and processes.

Further, a plurality of trenches 101 may be formed in the substrate 100 in the second surface S2. The plurality of trenches 101 may be used to subsequently form a plurality of semiconductor pillars in the substrate 100.

A process for forming the plurality of trenches 101 may include forming a patterned mask layer on the second surface S2 of the substrate 100 to define the position of the plurality of trenches 101; etching the substrate 100 using the patterned mask layer as an etching mask; and removing the patterned mask layer. Thus, the plurality of trenches 101 may be formed.

The patterned mask layer may be a patterned photoresist layer, or a patterned hard mask layer, etc. The substrate 100 may be etched by any appropriate process, such as a dry etching process, a wet etching process, or an ion beam etching process, etc. The patterned mask layer may be removed by any appropriate process, such as a dry etching process, a wet etching process, or a plasma ashing process, etc.

Figure 6:
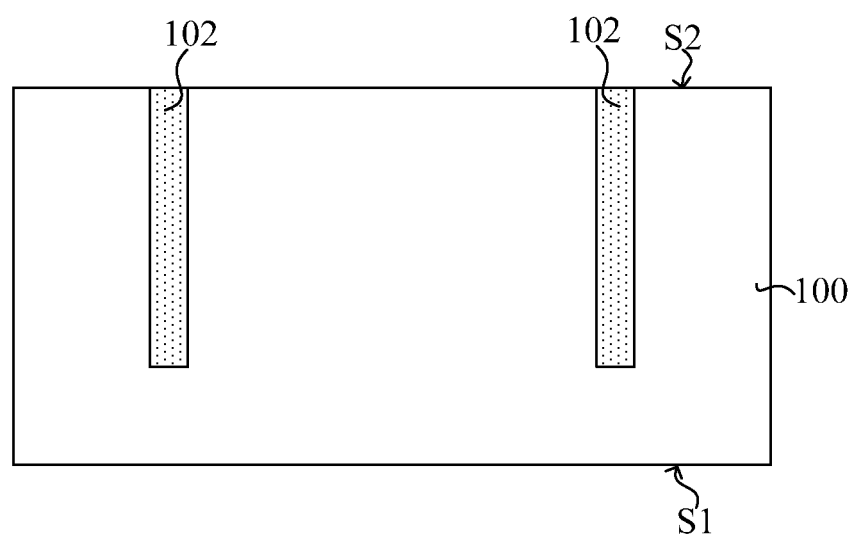

Returning to FIG. 17, after forming the plurality of trenches 101, a plurality of semiconductor pillars may be formed in the plurality of trenches 101 (S102). FIG. 6 illustrates a corresponding semiconductor structure.

As shown in FIG. 6, a semiconductor pillar 102 is formed in each of the plurality of trenches 101. The top surface of the semiconductor pillars 102 may level with the second surface S2 of the substrate 100. Further, the semiconductor pillars 102 may be doped with second type doping ions. The doping type of the semiconductor pillars 102 may be opposite to the doping type of the substrate 100. Thus, in one embodiment, the second doping type is P-type. A semiconductor pillar 102 and the substrate 100 may form a super junction of the power semiconductor device.

A process for forming the semiconductor pillars 102 may include forming a semiconductor material layer on the second surface S2 and in the plurality of trenches 101; and followed by planarizing the semiconductor material layer until the second surface S2 is exposed. Thus, the semiconductor pillars 102 may be formed in the plurality of trenches 101.

The semiconductor pillars 102 may be made of any appropriate materials, such as polysilicon, III-group semiconductor material, V-group semiconductor material, a combination of different semiconductor materials, etc., as long as the semiconductor material has an acceptable filling ability. In one embodiment, the semiconductor pillars 102 are made of polysilicon. Comparing with other materials, polysilicon may have a better filling ability and a better compactness. Thus, the electric field may be uniformly distributed in substrate 100 during the turning-off process of the power semiconductor device.

Further, the lifetime of the carriers in polysilicon may be relatively short. The lifetime of the carriers may refer to the average time between the generations of the carriers and the recombination of the carriers. The lifetime of the carriers may represent the relaxation characteristics of the carriers in the semiconductor from a non-equilibrium condition to an equilibrium condition under the external impact, such as light or electric field, etc. Polysilicon has a plurality of crystal grains and a plurality of grain boundaries between adjacent crystal grains.

On one hand, the carriers in polysilicon may be scattered by the grain boundaries; and the energy of the carriers may be rapidly consumed. Thus, the lifetime of the carriers in polysilicon may be relatively short. On the other hand, the grain boundaries may serve the recombination centers of the carriers. The relatively large quantity of recombination centers (grain boundaries) in polysilicon may facilitate the recombination of the carriers. Thus, the lifetime of the carriers may be reduced.

The lifetime of the carriers in polysilicon may be relatively short. Thus, during the process for turning off the power semiconductor device, the voltage releasing current flowing through the semiconductor pillars 102 per unit time may be relatively large; and the power semiconductor device may be rapidly turned off. Accordingly, it may break the restriction between the on-state voltage and the turn-off time of the power device; and a relatively low on-state voltage and a relatively short turn-off time of the power semiconductor device may be achieved.

The semiconductor material layer may be formed by any appropriate process, such as a chemical vapor deposition (CVD) process, a physical vapor deposition (PVD) process, an atomic layer deposition (ALD) process, or a flowable CVD (FCVD) process, etc. In one embodiment, the semiconductor material layer is formed by a CVD process. During the CVD process, the semiconductor material layer may be in-situ doped. By in-situ doping the semiconductor material layer, a uniform doping may be obtained in the semiconductor material layer when the depth of the trenches 101 is relatively large.

As described previously, the lifetime of the carriers may be affected by the density of grain boundaries and the density of the recombination centers. The density of grain boundaries and the density of the recombination centers may be affected by the fabrication process of the polysilicon. Thus, during the fabrication process of the polysilicon, the process parameters may be controlled to obtain a relatively large density of grain boundaries and recombination centers so as to obtain a shorter lifetime of the carriers.

Further, during the fabrication process of polysilicon, the in-situ doping process may be controlled to cause a product of the doping concentration of the semiconductor pillar 102 and the width of the semiconductor pillar 102 to be equal to a product of the doping concentration the portion of the substrate 100 between two adjacent semiconductor pillars 102 and the width of the portion of the substrate 100 between the two adjacent semiconductor pillars 102. Such a combination may be able to obtain a charge equilibrium between the first type doping ions in the substrate 100 and the second type doping ions in the semiconductor pillars 102.

Thus, a triangle-distributed electric field in the substrate 100 may be turned into a rectangle-distributed electric field. Accordingly, the peak value of the electric field under a same collector voltage may be reduced; and the breakdown voltage of the power device may be increased. The width of the semiconductor pillar 102 refers to the width of the trench 101 along a distribution direction of the plurality of trenches 101, i.e., the size of the trench 101 along the distribution direction of the plurality of trenches 101. The width of the portion of the substrate 100 refers to the distance between two adjacent trenches 101.

The width of the semiconductor pillar 102 may be controlled by the width of the trenches 101. The width of the portion of the substrate 100 between the two adjacent semiconductor pillars 102 may be controlled by the distance between adjacent trenches 101. The doping concentration of the semiconductor pillars 102 may be controlled by the doping dosage of the in-situ doping process.

In one embodiment, the number of the trenches 101 is two. Accordingly, the number of the semiconductor pillars 102 is also two; and the number of the super junctions is also two. In certain other embodiments, the number of the trenches 101 may be one, two, or more than two. Accordingly, the number of the super junctions may also be one, two, or more than. The number of the trenches 101, i.e., the number of the super junctions may be designed based on the specific requirements of the power semiconductor device. The requirements may include a relatively high breakdown voltage, and a relatively low on-state voltage.

When the number of the trenches 101 is more than two, the plurality of trenches 101 may be uniformly distributed along a direction parallel to the second surface S2. Thus, the plurality of the semiconductor pillars 102 may be uniformly distributed with certain intervals. Thus, during the turning-off process of the power semiconductor device, the charges in the semiconductor pillars 102 and the charges in the substrate 100 may be at an equilibrium state. Accordingly, the electric field in the substrate 100 may be uniformly distributed; and the breakdown issue caused by an accumulated electric field may be avoided.

Further, the deeper the trenches 101 are, the deeper the super junctions are. During the turning-off process of the power semiconductor device, the deeper super junctions may cause the electric field close to the first surface S1 to move deeper into the substrate 100. Thus, the breakdown voltage of the power semiconductor device may be enhanced.

The semiconductor material layer may be planarized by any appropriate process, such as a chemical mechanical polishing (CPM) process, or a physical mechanical polishing process, etc. In one embodiment, a CMP processes is used to planarize the semiconductor material layer to form the semiconductor pillars 102 in the plurality of trenches 101.

Thus, comparing the approach utilizing a plurality of epitaxial growth processes and a plurality of ion implantation processes, the current disclosed method may be relatively simple. The production time may be reduced; the production efficiency may be improved; and the production cost may be reduced. Further, the processes for forming the trenches 101 may be relatively mature processes of the integrated circuit (IC) manufacturing. Thus, relatively deep trenches may be formed. Correspondingly, relatively deep super junctions may be formed; and the breakdown voltage of the power semiconductor device may be improved.

Figure 7:
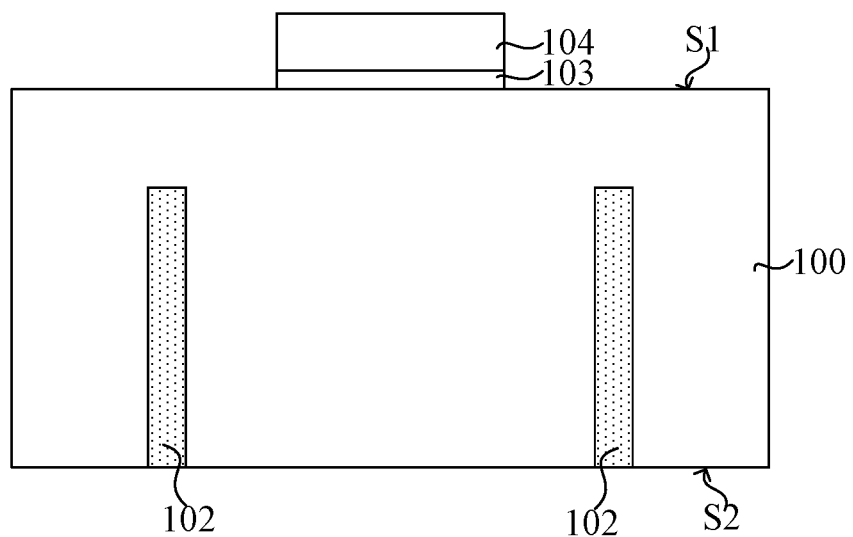

Returning to FIG. 17, after forming the semiconductor pillars 102, a gate structure may be formed on the first surface S1 of the substrate 100 (S103). FIG. 7 illustrates a corresponding semiconductor structure.

As shown in FIG. 7, a gate structure (not labeled) is formed on the first surface S1 of the substrate 100. The gate structure may include a gate dielectric layer 103 formed on the first surface S1 of the substrate 100; and a gate layer 104 formed on the gate dielectric layer 103. The gate structure may face the region between two adjacent semiconductor pillars 102.

The gate dielectric layer 103 may be made of any appropriate material. In one embodiment, the gate dielectric layer 103 is made of silicon oxide. The gate layer 104 may be made of any appropriate material. In one embodiment, the gate layer 104 is made of polysilicon.

A process for forming the gate structure may include forming a gate dielectric material layer on the first surface S1 of the substrate 100; forming a gate material layer on the gate dielectric material layer; and followed by patterning the gate material layer and the gate dielectric material layer. Thus, the gate dielectric layer 103 and the gate layer 104 may be formed.

The gate dielectric material layer and the gate material layer may be formed by any appropriate process, such as a CVD process, a PVD process, an ALD process, or an FCVD process, etc. Various processes may be used to pattern the gate dielectric material layer and the gate material layer, such as a dry etching process, a wet etching process, or an ion beam etching process, etc.

For illustrative purposes, one gate structure is shown in FIG. 7. In certain other embodiments, more than one gate structure may be formed on the substrate 100.

Figure 8:
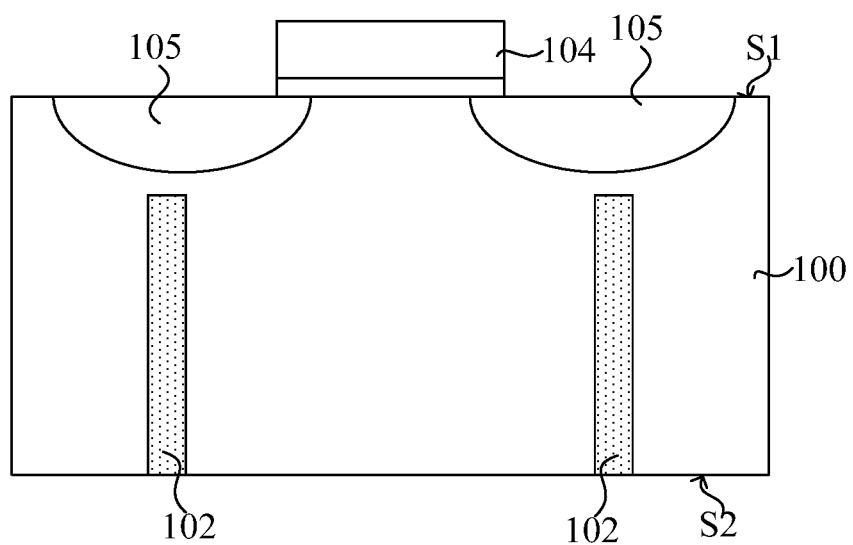

Returning to FIG. 17, after forming the gate structure, a first ion implantation process may be performed (S104). FIG. 8 illustrates a corresponding semiconductor structure.

As shown in FIG. 8, a first ion implantation process is performed on the first surface S1 at both sides of the gate structure; well regions 105 are formed in first surface S1 at both sides of the gate structure. The doping type of the first ion implantation process may be the second type. That is, the well regions 105 may be P-type doped. Further, the well regions 105 may penetrate under the gate structure along the first surface S1 with a certain lateral scale.

In certain other embodiments, the first ion implantation process may be performed on a plurality of positions of the first surface S1 around the gate structure. Accordingly, a plurality of well regions may be formed in the first surface S1 of the substrate 100 around the gate structure.

A process for forming the well regions 105 may include forming a patterned mask layer on the first surface S1 and the gate structure; performing the first ion implantation process using the patterned mask layer as a mask; and removing the patterned mask layer. After removing the patterned mask layer, a drive-in process may be performed to cause the doped regions to penetrate under the gate structure along the first surface S1 with the predetermined lateral scale.

In certain other embodiments, the first ion implantation process may include an inclining ion implantation process. That is, the direction of the ion implantation process may not be perpendicular to the first surface S1. Thus, the doping ions may diffuse under the gate structure along the first surface S1.

In certain other embodiments, the well regions 105 may be formed first. Then, the gate structure may be formed.

Further, as shown in FIG. 8, the two well regions 105 may be aligned with the two semiconductor pillars 102, respectively. In certain other embodiments, the semiconductor pillars may be not aligned with the well regions.

Further, as shown in FIG. 8, the well regions 105 do not contact with the semiconductor pillars 102. In certain other embodiments, the well regions 105 may contact with the semiconductor pillars 102 by adjusting the doping depth of the first ion implantation process. Thus, during the turning-off process of the power semiconductor device, it may be equivalent that the peak electric field goes deeper into the substrate 100 from the first surface S1. Accordingly, the breakdown region may be increased; and the breakdown voltage of the power semiconductor device may be enhanced.

Further, as shown in FIG. 8, the two semiconductor pillars 102 (the two trenches 101) may be distributed under the two well regions 105. In certain other embodiments, two or more semiconductor pillars (trenches) may be formed under the gate structure. All the semiconductor pillars may be evenly distributed in the substrate 100 under the gate structure and the well regions 105.

Figure 9:
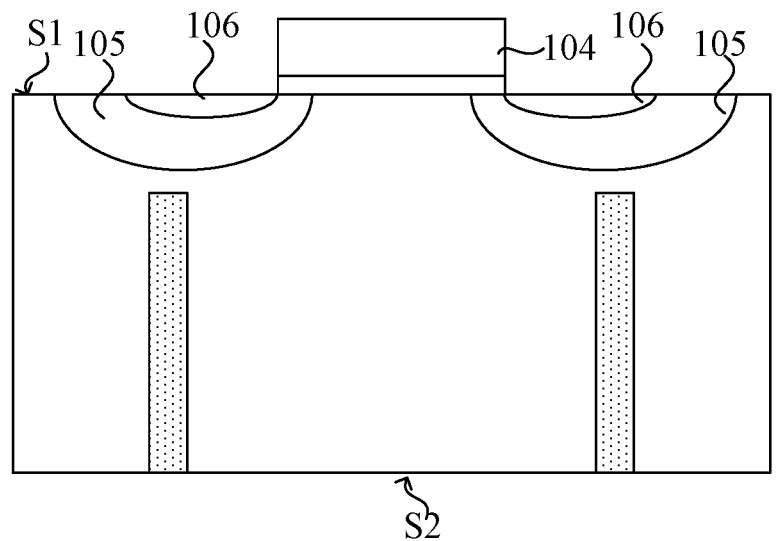

Returning to FIG. 17, after forming the well regions 105, a second ion implantation process may be performed (S105). FIG. 9 illustrates a corresponding semiconductor structure.

As shown in FIG. 9, a second ion implantation process may be performed in the well regions 105 at both sides of the gate structure; and source regions 106 may be formed in the well regions 105. Comparing with the well regions 105, the source regions 106 are heavily doped. In one embodiment, the doping ions of the second ion implantation process may be the first type doping ions. That is, the source regions 106 may be N-type doped. Further, the portions of the well regions 105 penetrating under the gate structure and close to the first surface S1 may be used to form a channel region.

Figure 10:
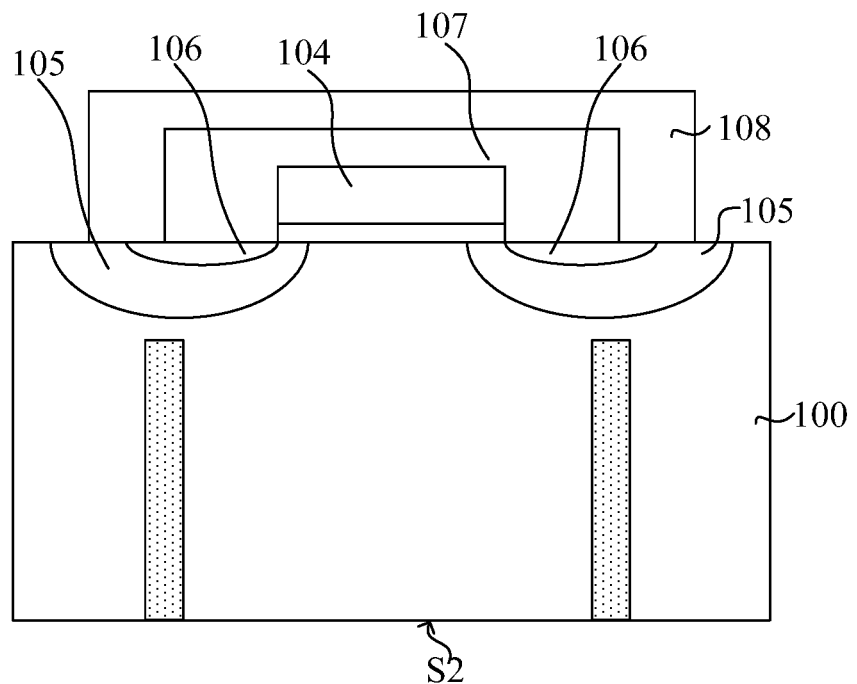

Returning to FIG. 17, after forming the source regions 106, an interlayer dielectric layer and a metal gate layer may be formed (S106). FIG. 10 illustrates a corresponding semiconductor structure.

As shown in FIG. 10, an interlayer dielectric layer 107 is formed on the first surface S1 of the substrate 100 and the surface of the gate structure. The interlayer dielectric layer 107 may cover portions of the source regions 106 close to the gate structure; and may expose portions of the surfaces of the source regions 106 connecting with the well regions 105.

Further, a metal gate layer 108 may be formed on the top and the side surfaces of the interlayer dielectric layer 107. The metal gate layer 108 may cover the portions of the surfaces of the well regions 105 close to the source regions 106 and the portions of the surfaces of the source regions 106 close to the well regions 105. That is, the metal gate layer 108 may short-circuit the source regions 106 and the well regions 105.

The interlayer dielectric layer 107 may be made of any appropriate material, such as silicon oxide, silicon nitride, or silicon oxynitride, etc. Various processes may be used to form the interlayer dielectric layer 107, such as a CVD process, a PVD process, or an ALD process, etc.

In one embodiment, a process for forming the metal gate layer 108 may include forming a metal material layer on the interlayer dielectric layer 107; and followed by patterning the metal material layer. Thus, the metal gate layer 108 may be formed.

The metal gate layer 108 may be made of any appropriate material, such as Cu, Al, or W, etc. In one embodiment, the metal gate layer 108 is made of Al. Various processes may be used to form the metal material layer, such as a CVD process, a PVD process, or an FCVD process, etc.

The metal material layer may be patterned by a photolithography process and an etching process. The etching process may include a dry etching process, a wet etching process, or an ion beam etching process, etc.

In one embodiment, the semiconductor pillars 102 are formed in the second surface S2 first; and then the gate structure, the well regions 105, the source regions 106, and the metal gate layer 108 may be formed on the first surface S1. Such a process sequence may prevent the high temperature process for forming the semiconductor pillars 102 from affecting the electrical performance of the device structures formed on the first surface S1.

In certain other embodiments, if the semiconductor pillars can be formed by a low temperature process, the gate structure, the well regions 105, the source regions 106, and the metal gate layer 108 may be formed first. Then, the semiconductor pillars may be formed.

Figure 11:
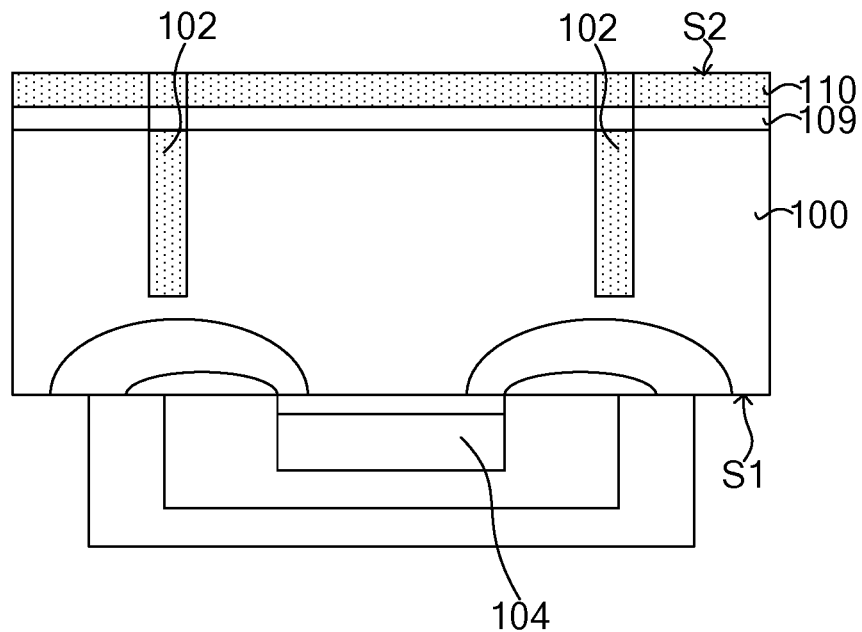

Returning to FIG. 17, after forming the metal gate layer 108, a buffer layer and a collector layer may be formed (S107). FIG. 11 illustrates a corresponding semiconductor structure.

As shown in FIG. 11, a buffer layer 109 may be formed in the second surface S2 of the substrate 100 and the semiconductor pillars 102; and a collector layer 110 may be formed in the buffer layer 109. Before forming the buffer layer 109 and the collector layer 110, the substrate 100 may be thinned to a predetermined thickness.

The collector layer 110 may be doped with the second type doping ions. That is, the collector layer 110 may be P-type doped. The buffer layer 109 may be doped with the first type doping ions. That is, the buffer layer 109 may be N-type doped. The doping concentration of the buffer layer 109 may be greater than the doping concentration of the substrate 100 so as to reduce the contact resistance.

A process for forming the buffer layer 109 and the collector layer 110 may include performing a third ion implantation process with the first type doping ions on the second surface S2 to a predetermined depth. Thus, the buffer layer 109 may be formed in the second surface of the substrate 100. The first type may be N-type. Thus, the doping type of the portions of the second conductor pillars 102 in the buffer layer 109 may become an opposite type, i.e., N-type.

After forming the buffer layer 109, a fourth ion implantation process with the second type doping ions may be performed on the buffer layer 109 to a predetermined depth. Thus, the collector layer 110 may be formed in the second surface S2 and in the buffer layer 109. The second type may be P-type. The doping type of the portions of the semiconductor pillars 102 in the collector layer 110 may be P-type.

After forming the buffer layer 109 and the collector layer 110, a thermal annealing process may be performed to activate the doping ions in the buffer layer 109 and the doping ions in the collector layer 110. The thermal annealing process may be any appropriate thermal annealing process. In one embodiment, the thermal annealing process is a rapid laser thermal annealing process.

In one embodiment, the buffer layer 109 and the collector layer 110 may be formed on the second surface S2 after forming the gate structure, etc. Such a process sequence may prevent the high temperature of the laser thermal annealing process from affecting the electrical performance of the device structures formed on the first surface S1.

Figure 12:
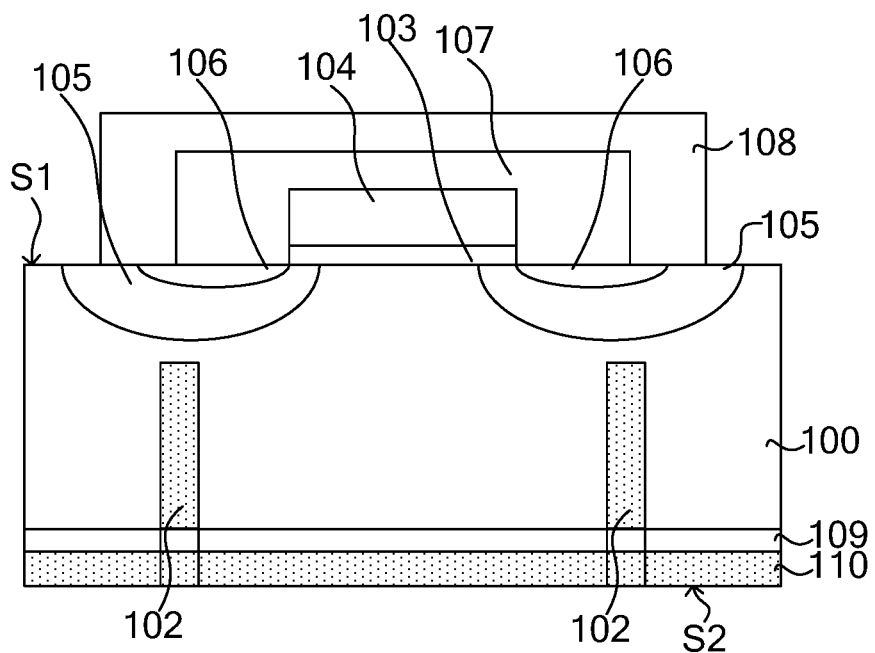

Optionally or additionally, as shown in FIG. 12, after forming the buffer layer 109 and the collector layer 110, the power device may be turned upside-down. Thus, the power semiconductor device (IGBT) may be formed. During the process for turning-on the IGBT, a current may flow in the substrate 100 from second surface S2 to the first surface S1. During the turning-off process of the IGBT, the electric field in the substrate 100 may move deeper in substrate 100 from the first surface S1. Thus, the breakdown voltage of the IGBT may be increased.

In certain other embodiments, the super junctions may be also used in the vertical double diffusion metal-oxide semiconductor (VDMOS) transistors. The major difference between a VDMOS transistor and the IGBT may include that it may not need to form a collector layer on the second surface, i.e., the surface facing the surface having the gate structure, of the substrate.

In one embodiment, the substrate 100 may be thinned from the second surface S2 after forming the gate structure on the first surface S1. Such a process sequence may ensure the substrate 100 to have enough thickness to support the processes for forming device structures on the first surface S1 of the substrate 100.

Thus, a power semiconductor device may be formed by the above disclosed processes and methods; and the corresponding power device is illustrated in FIG. 12. As shown in FIG. 12, the power semiconductor device includes a substrate 100 having a first surface S1 and a second surface S2; and a gate structure having the gate dielectric layer 103 formed on the first surface S1 of the substrate 100 and a gate layer 104 formed on the gate dielectric layer 103. Further, the power device may also include well regions 105 formed in the first surface S1 of the substrate 100 at both sides of the gate structure; and a source region 106 formed in each of the well-regions 105 at both sides of the gate structure. Further, the power semiconductor device may include an interlayer dielectric layer 107 formed on the gate structure and portions of the surfaces of source regions 106 close to the gate structure; and a metal gate layer 108 formed the side and bottom surface of the interlayer dielectric layer 107 on the portions of surfaces of the sources regions 106 close to the well regions 105 along the first surface S1 and the portions of the surfaces of the well regions 105 close to the source region regions 106 along the first surface S1, the metal gate layer 108 short-circuiting the source regions 106 and the well regions 105. Further, the power semiconductor device may also include a plurality of the semiconductor pillars 102 formed in the second surface of the substrate 100; and the semiconductor pillars 106 and the substrate 100 are configured as the super junctions of the power semiconductor device. Further, the power semiconductor device may also include a buffer layer 109 formed in the second surface S2 of the substrate 110; and a collector layer 110 formed in the second surface S2 and in the buffer layer 109. The detailed structures and intermediate structures are described above with respect to the fabrication processes.

Figure 18:
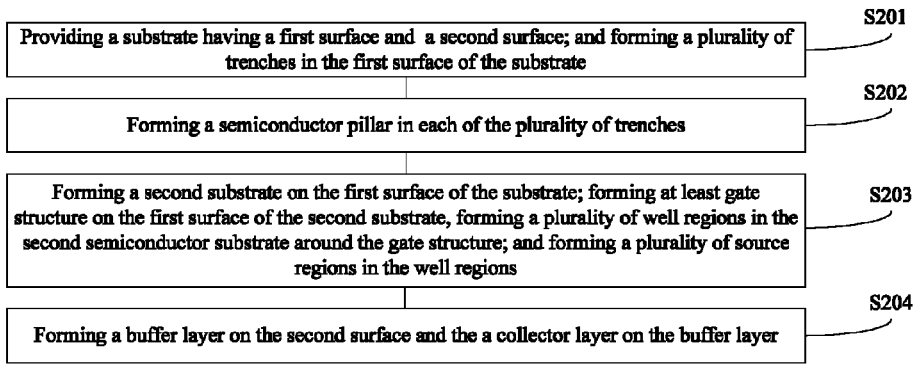
FIG. 18 illustrates another exemplary fabrication process of a power device consistent with the disclosed embodiments.

FIG. 18 illustrates another exemplary fabrication process of a power semiconductor device consistent with the disclosed embodiments; and FIGS. 13~16 illustrate semiconductor structures corresponding to certain stages of the exemplary fabrication process.

Figure 13:
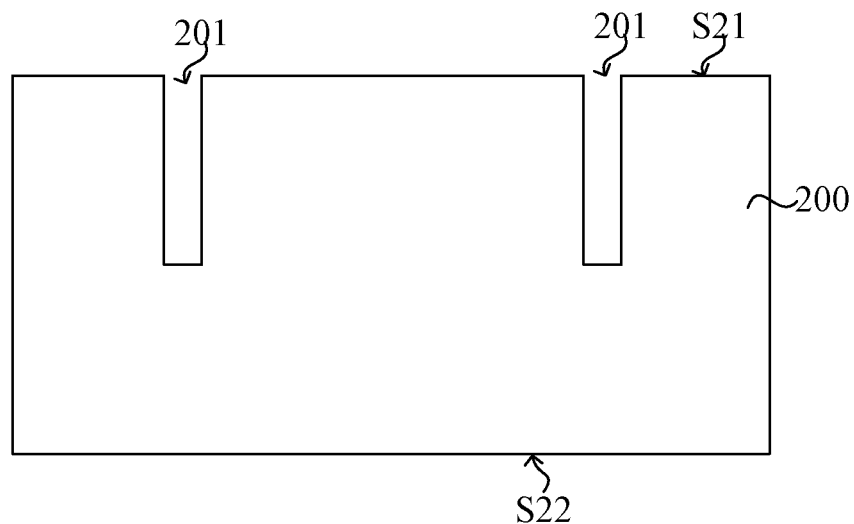
FIGS. 13~16 illustrate semiconductor structures corresponding to certain stages of another exemplary fabrication process of a power semiconductor device consistent with the disclosed embodiments.

As shown in FIG. 18, at the beginning of fabrication process, a substrate with certain structures is provided (S201). FIG. 13 illustrates a corresponding semiconductor structure.

As shown in FIG. 13, a substrate 200 is provided. The substrate 200 may have a first surface S21 and an opposite facing second surface S22. In certain other embodiments, the first surface S21 may be referred as a front surface; and the second surface S22 may be referred as a back surface.

The substrate 200 may be doped with first type doping ions. In one embodiment, the first type doping ions are N-type doping ions.

The substrate 200 may be made of any appropriate semiconductor materials, such as single crystal silicon, polysilicon, silicon on insulator (SOI), silicon germanium, carborundum, indium antimonite, lead telluride, indium arsenide, indium phosphide, gallium arsenide, gallium antimonite, alloy semiconductor or a combination thereof. In one embodiment, the semiconductor substrate 200 is made of silicon. Thus, the production cost of the power device may be reduced. The substrate 200 provides a base for subsequent devices and processes.

Further, a plurality of trenches 201 may be formed in the substrate 200 in the first surface S21. The plurality of the trenches 201 may be used to subsequently form semiconductor pillars.

A process for forming the plurality of trenches 201 may include forming a patterned mask layer on the first surface S21 of the substrate 200 to define the position of the plurality of trenches 201; etching the substrate 200 using the patterned mask layer as an etching mask; and removing the patterned mask layer. Thus, the plurality of trenches 201 may be formed.

Figure 14:
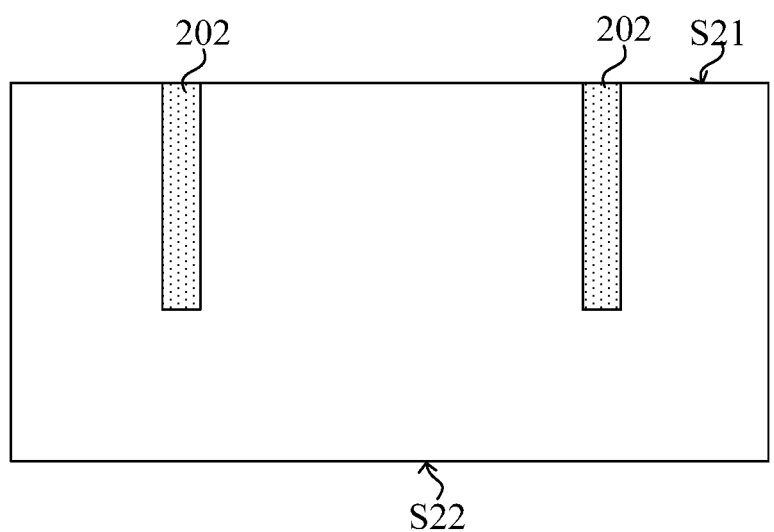

Returning to FIG. 18, after forming the plurality of trenches 201, a plurality of semiconductor pillars may be formed (S202). FIG. 14 illustrates a corresponding semiconductor structure.

As shown in FIG. 14, a semiconductor pillar 202 is formed in each of the plurality of trenches 201. The top surfaces of the semiconductor pillars 202 may level with the first surface S21 of the substrate 200. Further, the semiconductor pillars 202 may be doped with second type doping ions. The doping type of the semiconductor pillars 202 may be opposite to the doping type of the substrate 200. Thus, in one embodiment, the second type is P-type. A semiconductor pillar 202 and the substrate 200 may form a super junction structure of the power semiconductor device.

A process for forming the semiconductor pillars 202 may include forming a semiconductor film on the first surface S21 and in the plurality of trenches 201; and followed by planarizing the semiconductor film until the first surface S21 is exposed. Thus, the semiconductor pillars 202 may be formed in the plurality of trenches 201.

The semiconductor pillars 202 may be made any appropriate materials, such as polysilicon, III-group semiconductor material, V-group semiconductor material, or a combination of different semiconductor materials, etc., as long as the semiconductor material has an acceptable filling ability. In one embodiment, the semiconductor pillars 202 are made of polysilicon. Comparing with other materials, polysilicon may have better filling ability and better compactness. Thus, the electric field may be uniformly distributed in substrate 200 during the turning-off process of the power semiconductor device.

The lifetime of the carriers in polysilicon may be relatively short. Thus, during the process for turning off the power semiconductor device, the voltage releasing current flowing through the semiconductor pillars 202 per unit time may be relatively large; and the power semiconductor device may be rapidly turned off. Accordingly, it may break the restriction between the on-state voltage and the turn-off time of the power semiconductor device; and a relatively low on-state voltage and a relatively short turn-off time of the power device may be achieved.

Comparing the approach utilizing a plurality of epitaxial growth processes and a plurality of ion implantation processes, the disclosed method may be relatively simple. The production time may be reduced; the production efficiency may be improved; and the production cost may be reduced. Further, the process for forming the trenches 201 may be a relatively mature process in the IC manufacturing processes. Thus, relatively deep trenches may be formed. Correspondingly, relatively deep super junctions may be formed; and the breakdown voltage of the power device may be increased.

Figure 15:
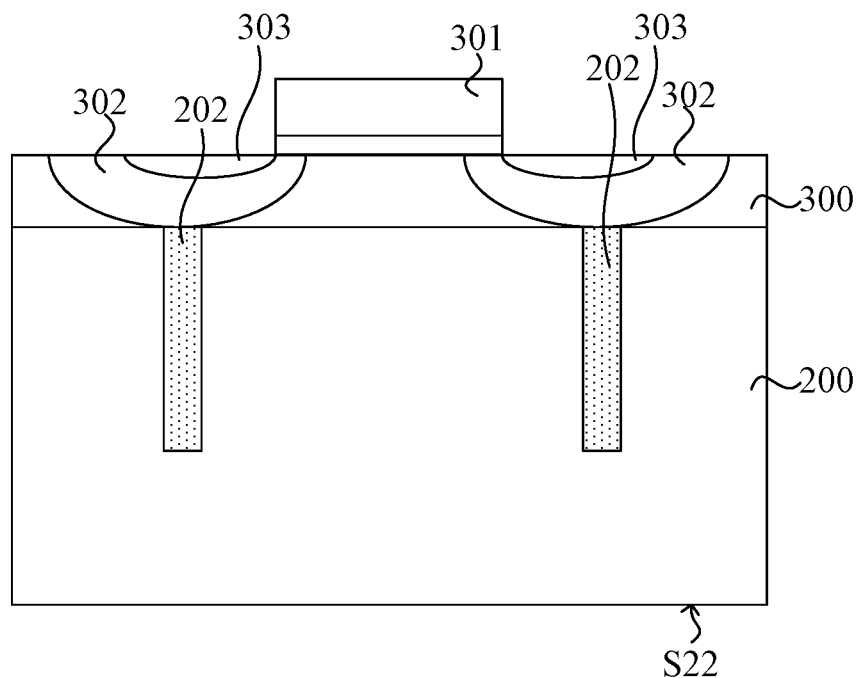

Returning to FIG. 18, after forming the semiconductor pillars 202, a second substrate may be formed; and well regions, source regions and a gate structure may be formed (S203). FIG. 15 illustrates a corresponding semiconductor structure.

As shown in FIG. 15, a second substrate 300 may be formed on the first surface S21 of the substrate 200 and the surfaces of the semiconductor pillars 202. Further, a gate structure (not labeled) having a gate dielectric layer (not labeled) and a gate layer 301 may be formed on the surface of the second substrate 300. Further, well regions 302 may be formed in the second substrate 300 at both sides of the gate structure; and source regions 303 may be formed in the well regions 302 at both sides of the gate structure.

The second substrate 300 may be made of any appropriate material, such as silicon, silicon germanium, or compound semiconductor, etc.; and doped with certain type ions. In one embodiment, the second substrate 300 is doped with the first type doping ions. That is, the second substrate 300 may be N-type doped.

Various processes may be used to form the second substrate 200, such as a CVD process, a PVD process, or an epitaxial growth process, etc. In one embodiment, the second substrate 200 is formed by a CVD process. The second substrate 200 may be in-situ doped during the CVD process.

The gate structure may be in between two adjacent semiconductor pillars 202. The gate dielectric layer may be made of any appropriate material. In one embodiment, the gate dielectric layer is made of silicon oxide. The gate layer 301 may be made of any appropriate material. In one embodiment, the gate layer 301 is made of polysilicon.

A process for forming the gate structure may include forming a gate dielectric material layer on the first surface S21 of the second substrate 300; forming a gate material layer on the gate dielectric material layer; and followed by patterning the gate material layer and the gate dielectric material layer. Thus, the gate dielectric layer and the gate layer 301 may be formed.

For illustrative purposes, one gate structure is shown in FIG. 15. In certain other embodiments, more than one gate structure may be formed on the second substrate 300.

The well regions 302 may be formed by performing a first ion implantation process on the surface of the second substrate 300 at both sides of the gate structure. The doping type of the first ion implantation process may be the second type. That is, the well regions 302 may be P-type doped. Further, the P-type well regions 302 may penetrate under the gate structure along the surface of the second substrate 300 with a certain lateral scale.

In certain other embodiments, the first ion implantation process may be performed on a plurality of positions of the surface of the second substrate 300 around the gate structure. Accordingly, a plurality of P-type well regions may be formed in the surface of the second substrate 300 around the gate structure.

Further, as shown in FIG. 15, the two well regions 302 may be aligned with the two semiconductor pillars 202, respectively. In certain other embodiments, the semiconductor pillars 202 may be not aligned with the well regions.

Further, as shown in FIG. 15, the well regions 302 may contact with the semiconductor material pillars 202. In certain other embodiments, the well regions 203 may not contact with the semiconductor pillars 202.

Further, as shown in FIG. 15, the two semiconductor pillars 202 (the two trenches 201) may be distributed under the two well regions 302. In certain other embodiments, two or more semiconductor pillars (trenches) may be formed under the gate structure. All the semiconductor pillars may be evenly distributed in the substrate 200 under the gate structure and the well regions 302.

Further, after forming the well regions 302, a second ion implantation process may be performed in the well regions 302 at both sides of the gate structure; and the source regions 303 may be formed in the well regions 302. Comparing with the well regions 302, the source regions 303 may be heavily doped. In one embodiment, the doping ions of the second ion implantation process may be the first type doping ions. That is, the source regions 303 may be N-type doped.

Figure 16:
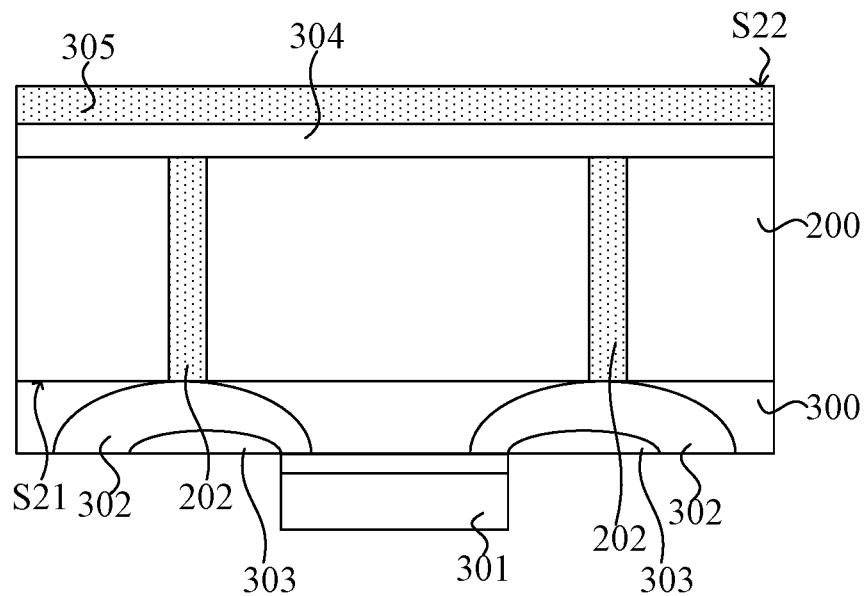

Returning to FIG. 18, after forming source regions 303, a buffer layer and a collector layer may be formed (S204). FIG. 16 illustrates a corresponding semiconductor structure.

As shown in FIG. 16, a buffer layer 304 may be formed in the second surface S22 of the substrate 200 and the semiconductor pillars 202; and a collector layer 305 may be formed on the buffer layer 304. Before forming the buffer layer 304 and the collector layer 305, the substrate 200 may be thinned to a pre-determined thickness.

The collector layer 305 may be doped with the second type doping ions. That is, the collector layer 305 may be P-type doped. The buffer layer 304 may be doped with the first type doping ions. That is, the buffer layer 304 may be N-type doped.

A process for forming the buffer layer 304 and the collector layer 305 may include performing a third ion implantation process with the first type doping ions on the second surface S22 to a pre-determined depth. Thus, the buffer layer 304 may be formed in the second surface S22 of the substrate 200. The first doping type may be N-type. Thus, the doping type of the portions of the semiconductor pillars 202 in the buffer layer 304 may become an opposite type, i.e., N-type.

After forming the buffer layer 304, a fourth ion implantation process with the second type doping ions may be performed on the buffer layer 304 to a predetermined depth. Thus, the collector layer 305 may be formed in the second surface S22 and in the buffer layer 305. The second type may be P-type. Thus, the doping type of the portions of the semiconductor pillars 202 in the collector layer 305 may be P-type.

After forming the buffer layer 304 and the collector layer 305, a thermal annealing process may be performed to activate the doping ions in the buffer layer 304 and the doping ions in the collector layer 305.

After forming the buffer layer 304 and the collector layer 305, an interlayer dielectric layer and a metal gate layer (not shown) may be formed on the surfaces of the second substrate 300 and the gate structure. The interlayer dielectric may cover portions of the source regions 303 close to the gate structure; and expose portions of the surfaces of the source regions 303 connecting with the well regions 302. The metal gate layer may be formed on the top and the side surfaces of the interlayer dielectric layer. The metal gate layer may cover the portions of the surfaces of the well regions 302 close to the source regions 303 and the portions of the surfaces of the source regions 303 close to the well regions 302. That is, the metal gate layer may short-circuit the source regions 303 and the well regions 302. Thus, the power semiconductor device (IGBT) may be formed.

According to the disclosed methods and structures, the super junctions of the power semiconductor device may be formed by forming a plurality of trenches; and then filling the trenches with a semiconductor material to form a plurality of semiconductor pillars. The process for forming the trenches and filling the trenches may be relatively mature processes in the IC manufacturing. Thus, it may be relatively simple to form the trenches and fill the trenches with a semiconductor material to form the semiconductor pillars. Further, the depth of the trenches may be easily controlled; and semiconductor pillars with a relatively large height may be obtained. Comparing with the approach utilizing a plurality of epitaxial growth processes and a plurality of ion plantation processes to form the super junctions, the disclosed process may have fewer process steps; and the processes may be relatively simple. Thus, the production time may be reduced; the production efficiency may be improved; and the production cost may be reduced.

The above detailed descriptions only illustrate certain exemplary embodiments of the present invention, and are not intended to limit the scope of the present invention. Those skilled in the art can understand the specification as whole and technical features in the various embodiments can be combined into other embodiments understandable to those persons of ordinary skill in the art. Any equivalent or modification thereof, without departing from the spirit and principle of the present invention, falls within the true scope of the present invention.

What is claimed is:

1. A method for fabricating a power semiconductor device, comprising:
   providing a substrate having a first surface and a second surface;
   forming a plurality of trenches in the second surface of the substrate;
   forming a semiconductor pillar in each of the plurality of trenches, wherein the semiconductor pillars and the substrate form a plurality of super junctions of the power semiconductor device for increasing the breakdown voltage of the power semiconductor device and reducing the on-stage voltage of the power semiconductor device;

forming a gate structure on the first surface of the substrate over the plurality of super junctions;

forming a plurality of well regions in the first surface of the substrate around the gate structure; and forming a source region in each of the plurality of well regions around the gate structure.

2. The method according to claim 1, wherein:
the substrate is doped with first type doping ions;
the semiconductor pillars are doped with second type doping ions opposite to the first type doping ions;
the source regions are doped with the first type doping ions; and
the well regions are doped with the second type doping ions.

3. The method according to claim 1, further comprising:
forming an interlayer dielectric layer on portions of the source regions close to the gate structure;
forming a metal gate layer on top and side surfaces of the interlayer dielectric layer, wherein the metal gate layer covers portion of the source regions close to the well regions and portions of well regions close the source region;
forming a buffer layer in the second surface of the substrate; and
forming a collector layer in the second surface of the substrate and in the buffer layer.

4. The method according to claim 3, before forming the buffer layer, further comprising:
thinning the substrate to a predetermined thickness.

5. The method according to claim 1, wherein forming the semiconductor pillars further comprises:
forming a semiconductor material layer on the second surface of the substrate and in the plurality of trenches; and
planarizing the semiconductor material layer until the second surface of the substrate is exposed.

6. The method according to claim 1, wherein:
the semiconductor pillars are aligned with the well regions.

7. The method according to claim 1, wherein:
the plurality of semiconductor pillars are evenly distributed in the substrate under the gate structure and the well regions.

8. The method according to claim 7, wherein:
a product of a doping concentration of the semiconductor pillar and a width of the trench is equal to a product of a doping concentration of a portion of the substrate between adjacent semiconductor pillars and a width of the portion of the substrate between adjacent semiconductor pillars.

9. The method according to claim 1, wherein:
the semiconductor pillars are made of polysilicon.

10. A method for fabricating a power semiconductor device, comprising:
providing a substrate having a first surface and a second surface;
forming a plurality of trenches in the first surface of the substrate;
forming a semiconductor pillar in each of the plurality of trenches, wherein the semiconductor pillars and the substrate form a plurality of super junctions of the power device for increasing the breakdown voltage of the power semiconductor device and reducing the on-stage voltage of the power semiconductor device;
forming a second substrate on the first surface of the substrate and surfaces of the plurality of semiconductor pillars;
forming a gate structure on a top surface of the second substrate;
forming a plurality of well regions in the top surface of the second substrate at both sides of the gate structure; and
forming a source region in each of the plurality of well regions at both sides of the gate structure.

11. The method according to claim 10, wherein:
the second substrate is formed by a chemical vapor deposition process.

12. The method according to claim 10, wherein:
the substrate is doped with first type doping ions;
the semiconductor pillars are doped with second type doping ions opposite to the first type doping ions;
the second semiconductor substrate is doped with the first type doping ions;
the source regions are doped with the first type doping ions; and
the well regions are doped with the second type doping ions.

13. The method according to claim 10, further comprising:
forming a buffer layer on the second surface of the substrate; and
forming a collector layer on the buffer layer.

14. The method according to claim 10, wherein forming the plurality of semiconductor pillars further comprises:
forming a semiconductor material layer on the first surface of the substrate and in the plurality of trenches; and
planarizing the semiconductor material layer until the first surface of the substrate is exposed.

15. The method according to claim 14, wherein:
the semiconductor material layer is made of polysilicon.

* * * * *